US009425185B2

(12) United States Patent
Gauthier, Jr. et al.

(10) Patent No.: US 9,425,185 B2
(45) Date of Patent: Aug. 23, 2016

(54) SELF-HEALING ELECTROSTATIC DISCHARGE POWER CLAMP

(71) Applicant: GLOBALFOUNDRIES INC., Grand Cayman (KY)

(72) Inventors: Robert J. Gauthier, Jr., Hinesburg, VT (US); Tom C. Lee, Essex Junction, VT (US); Junjun Li, Williston, VT (US); You Li, Essex Junction, VT (US); Souvick Mitra, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 189 days.

(21) Appl. No.: 14/290,141

(22) Filed: May 29, 2014

(65) Prior Publication Data

US 2015/0348960 A1 Dec. 3, 2015

(51) Int. Cl.
*H02H 9/00* (2006.01)
*H01L 27/02* (2006.01)
*H01L 23/525* (2006.01)
*H01G 17/00* (2006.01)
*H01G 13/00* (2013.01)

(52) U.S. Cl.
CPC ........ *H01L 27/0266* (2013.01); *H01L 23/5256* (2013.01); *H01G 13/00* (2013.01); *H01G 17/00* (2013.01); *H01L 2924/0002* (2013.01); *Y10T 29/435* (2015.01)

(58) Field of Classification Search
USPC .......................................................... 361/56
See application file for complete search history.

(56) References Cited

U.S. PATENT DOCUMENTS 5,394,294 A 2/1995 Mei et al.
5,730,165 A 3/1998 Philipp
5,841,334 A 11/1998 East
6,917,207 B1 7/2005 Blumenthal
6,965,503 B2 11/2005 Connor et al.
7,566,946 B2 7/2009 Coolbaugh et al.
7,639,462 B2 12/2009 Graebel et al.
7,724,485 B2 5/2010 Worley et al.
8,018,024 B2 9/2011 Herner
8,264,816 B2 9/2012 Bultitude et al.
8,841,174 B1 * 9/2014 Di Sarro ............ H01L 27/0262 257/173
2007/0285854 A1 * 12/2007 Rodgers ................ H02H 3/006 361/56
2009/0225481 A1 * 9/2009 Abou-Khalil ....... H01L 23/5256 361/56
2014/0160606 A1 * 6/2014 Su .......................... H02H 9/04 361/56
2015/0348960 A1 * 12/2015 Gauthier, Jr. ....... H01L 27/0266 361/56

* cited by examiner

*Primary Examiner* — Ronald W Leja

(74) *Attorney, Agent, or Firm* — Thompson Hine LLP; Anthony Canale

(57) ABSTRACT

Circuits and methods of fabricating circuits that provide electrostatic discharge protection, as well as methods of protecting an integrated circuit from electrostatic discharge. The protection circuit may include a power clamp device, a timing circuit including a resistor and a capacitor that is coupled with the resistor at a node, and a power clamp device coupled with the timing circuit at the node. The capacitor includes a plurality of capacitor elements. The protection circuit further includes a plurality of electronic fuses. Each electronic fuse is coupled with a respective one of the capacitor elements. A field effect transistor may be coupled in parallel with the resistor of the timing circuit, and may be used to bypass the resistor to provide a programming current to any electronic fuse coupled with a capacitor element of abnormally low impedance.

16 Claims, 4 Drawing Sheets

SELF-HEALING ELECTROSTATIC DISCHARGE POWER CLAMP

BACKGROUND

The invention generally relates to semiconductor manufacturing and integrated circuits and, more particularly, to circuits and methods of fabricating circuits that provide electrostatic discharge protection, as well as methods of protecting an integrated circuit from electrostatic discharge.

An integrated circuit may be exposed to electrostatic discharge (ESD) events that can direct potentially large and damaging ESD currents to the integrated circuits of the chip. An ESD event involves an electrical discharge from a source, such as the human body or a metallic object, over a short duration and can deliver a large amount of current to the integrated circuit. An integrated circuit may be protected from ESD events by, for example, incorporating an ESD protection circuit into the chip. If an ESD event occurs, the ESD protection circuit triggers a power clamp device, such as a silicon-controlled rectifier, to enter a low-impedance, conductive state that directs the ESD current to ground and away from the integrated circuit. The ESD protection device holds the power clamp device in its conductive state until the ESD current is drained and the ESD voltage is discharged to an acceptable level.

Improved circuits and methods of fabricating circuits that provide electrostatic discharge protection, as well as improved methods of protecting an integrated circuit from electrostatic discharge, are needed.

SUMMARY

In an embodiment of the invention, a method is provided for fabricating a timing circuit for a protection circuit. The method includes forming, using a substrate, a first capacitor element and a second capacitor element of a capacitor of the timing circuit. The method further includes forming a first electronic fuse coupled with the first capacitor element and forming a second electronic fuse coupled with the second capacitor element.

In an embodiment of the invention, a protection circuit includes a power clamp device, a timing circuit including a resistor and a capacitor that is coupled with the resistor at a node, and a power clamp device coupled with the timing circuit at the node. The capacitor includes a plurality of capacitor elements. The protection circuit further includes a plurality of electronic fuses each coupled with a respective one of the capacitor elements.

In another embodiment of the invention, a method is provided for operating a timing circuit of a protection circuit. The method includes applying a programming current to a first electronic fuse coupled with a first capacitor element of a capacitor of the timing circuit. The method further includes applying a non-programming current to a second electronic fuse coupled with a second capacitor element of the capacitor of the timing circuit.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
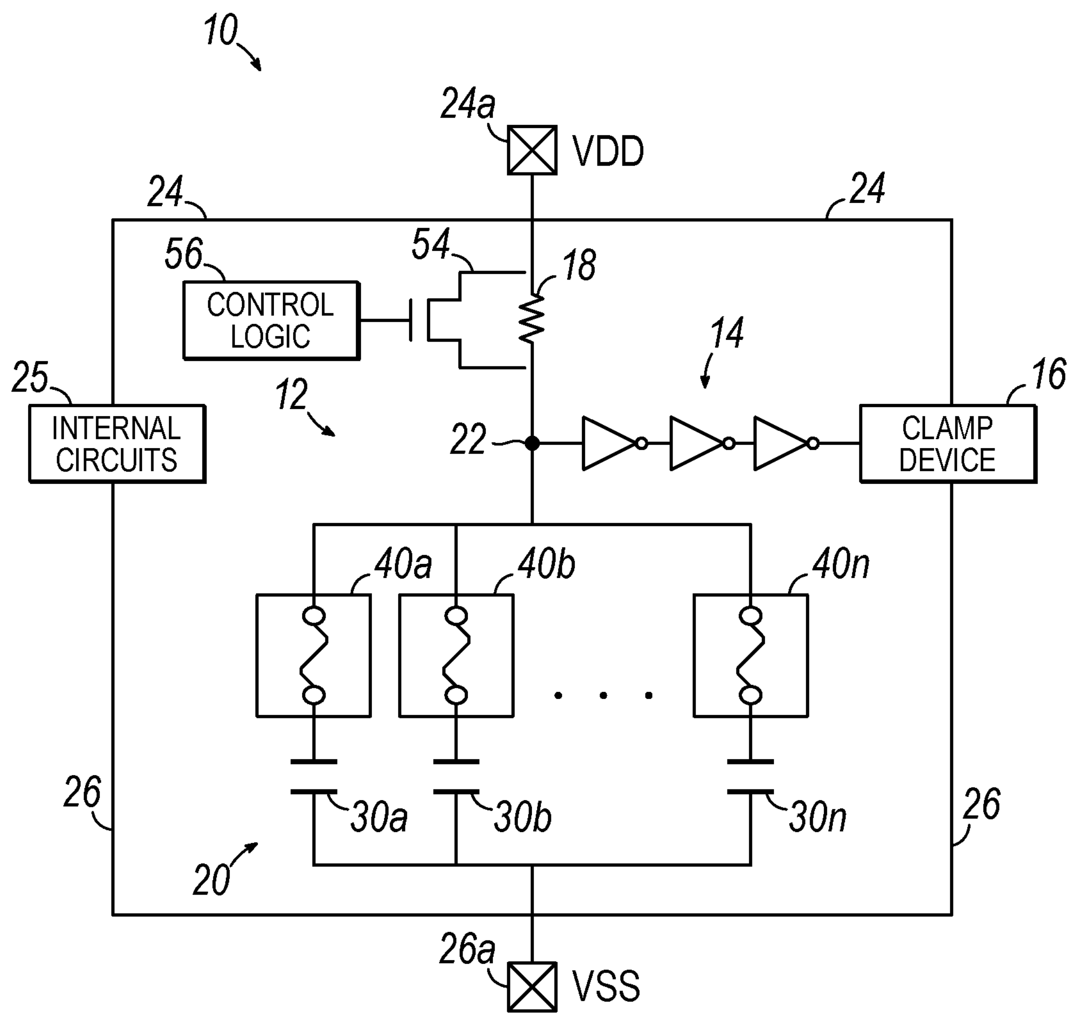
FIG. 1 is a circuit diagram for a timing circuit in accordance with an embodiment of the invention.
Figure 2:
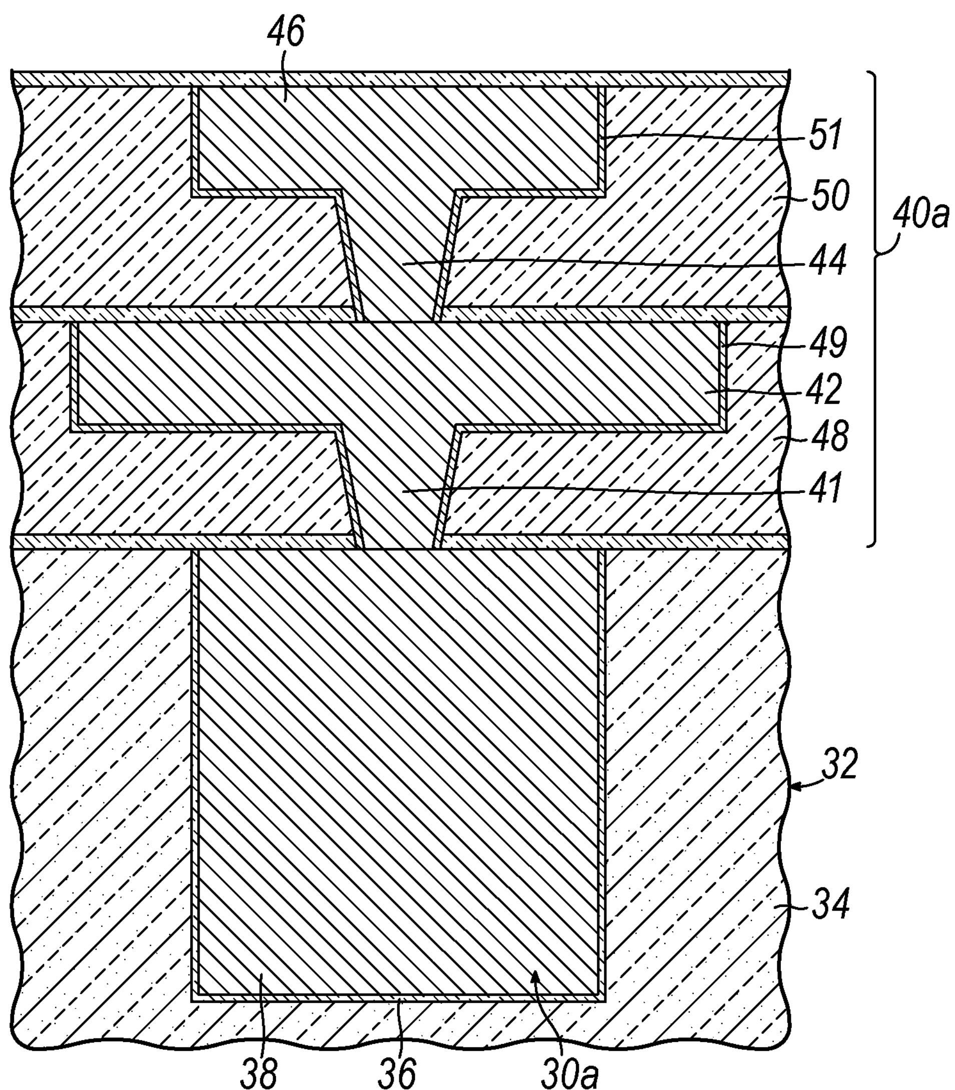
FIG. 2 is a cross-sectional view of an electronic fuse in the circuit diagram of FIG. 1.

With reference to FIGS. 1, 2 and in accordance with an embodiment of the invention, an electrostatic discharge (ESD) protection circuit 10 for a chip generally includes a filter or timing circuit 12, a driving circuit in the representative form of an inverter chain 14, and a power clamp device 16 coupled by the inverter chain 14 with the timing circuit 12. The timing circuit 12 includes a resistor 18 and a capacitor 20 that is coupled in series with the resistor 18 at a node 22. The timing circuit 12 is coupled between a positive power supply ($V_{DD}$) rail 24 and a negative power supply ($V_{SS}$) rail 26. Specifically, the resistor 18 is coupled with the $V_{DD}$ rail 24 and the capacitor 20 is coupled with the $V_{SS}$ rail 26. The $V_{DD}$ rail 24 is connected with a $V_{DD}$ power pin **24*a* and the $V_{SS}$ rail 26 is connected with a $V_{SS}$ power pin 26*a*. Internal circuits 25 of the chip, which are protected by the ESD protection circuit 10, are also connected with the $V_{DD}$ rail 24 and $V_{SS}$ rail 26**

The inverter chain 14 includes multiple serially-connected inverters in which one inverter in the inverter chain 14 has an output that is coupled with a gate of the power clamp device 16 and another inverter in the inverter chain 14 has an input that is coupled with the node 22 between the resistor 18 and capacitor 20. Each of the inverters in the inverter chain 14 includes a PFET and an NFET coupled in series with the PFET, and the inverter chain 14 may include a different number of individual inverters than shown in the representative three-stage configuration.

The power clamp device 16 that is triggered to dissipate the current from an ESD event may be a metal-oxide-semiconductor device of large dimensions (e.g., a BigFET), and constructed either a PMOSFET or an NMOSFET. Alternatively, the power clamp device 16 may have a different device construction, such as a silicon controlled rectifier. When triggered and clamped, the power clamp device 16 provides a low impedance path with a current-carrying capacity that is sufficient to dissipate the large current produced by an ESD event.

The resistor 18 may be constructed as a diffusion resistor, a well resistor, a pinched-well resistor, a polysilicon resistor, a MOSFET, etc.

During an ESD event that applies an ESD potential between the $V_{DD}$ rail 24 and the $V_{SS}$ rail 26, the timing circuit 12 triggers the inverter chain 14 to bias the power clamp device 16 with a voltage sufficient to switch on the power clamp device 16. The power clamp device 16 is thereby switched from a high impedance state to a low impedance state so as to provide a current path for a duration sufficient to discharge the ESD current, thereby clamping the $V_{DD}$ rail 24 to the $V_{SS}$ rail 26 (i.e., to ground). The power clamp device 16 will be triggered after a time delay that is given by the time constant of the timing circuit 12 (e.g., the product of the resistance of the resistor 18 and the capacitance of capacitor 20). Once triggered and latched, a current path provided in the power clamp device 16 directs the ESD current through the power clamp device 16 to the $V_{SS}$ rail 26, thereby clamping the $V_{DD}$ rail 24 to ground at the $V_{SS}$ rail 26.

The capacitor 20 may be comprised of multiple capacitor elements each having a discrete capacitance value and, in the representative embodiment, may be comprised of a plurality of deep trench capacitors 30*a*-30*n* that are coupled in parallel with each other. As a result of the parallel coupling, the individual capacitances of the deep trench capacitors 30*a*-30*n* are summed to provide a total capacitance for the capacitor 20. Each of the deep trench capacitors 30*a-n* includes capacitor plates (i.e., electrodes) and an intervening dielectric layer formed using a deep trench. In particular, each of the deep trench capacitors 30*a*-30*n* may have a construction as shown by the representative deep trench capacitor 30*a* as shown in FIG. 2. Deep trench capacitor 30*a* is formed by patterning a substrate 32 with, for example, lithography, mask opening, and reactive ion etching to form a deep trench. After the deep trench is formed, a doped region 34 may be formed in the substrate by introducing a suitable p-type or n-type dopant using, for example, ion implantation. The doped region 34 supplies a common lower capacitor plate for the deep trench capacitor 30*a*. A dielectric layer 36 (e.g., silicon dioxide, silicon oxynitride, silicon nitride, and/or hafnium oxide) is formed on the bottom and sidewall surfaces of the deep trench. The deep trench is filled with a low resistivity material (e.g., copper, tungsten, titanium nitride, and/or doped polysilicon) to supply an upper capacitor plate 38 of the deep trench capacitor 30*a*.

Alternatively, the capacitor 20 may be comprised of a plurality of metal-insulator-metal capacitors, a polysilicon-polysilicon capacitor, a MOS capacitor, etc.

The capacitor 20 formed using the deep trench capacitors 30*a-n* are compact structures relative to other types of capacitor structures that may be used in ESD protection timing circuits. Because of normal yield considerations, one or more of the individual deep trench capacitors 30*a-n* of the capacitor 20 may be fabricated in a defective condition or become defective during use so that one or more of the individual deep trench capacitors 30*a-n* the capacitor 20 exhibits an abnormally-low impedance or is leaky.

Electronic fuses (efuses) 40*a*-40*n* are associated with the deep trench capacitors 30*a-n*. In an embodiment, one of the efuses 40*a*-40*n* is associated with each of the deep trench capacitors 30*a-n* so that the deep trench capacitors 30*a*-30*n* and efuses 40*a*-40*n* are present in equal numbers and a one-to-one relationship exists. The efuses 40*a*-40*n* and the deep trench capacitors 30*a-n* are respectively coupled in series; the efuse 40*a* is coupled in series with deep trench capacitor 30*a* in a current path, the efuse 40*b* is coupled in series with deep trench capacitor 30*b* in a different and distinct current path, etc. At the time of fabrication and in its unprogrammed condition, each of the efuses 40*a*-40*n* is closed and has a low resistance value. This creates individual closed circuits defining current paths between the $V_{DD}$ rail 24 and the $V_{SS}$ rail 26 that may be current-carrying during power-on and upon the occurrence of an ESD event. In its programmed condition when subjected to a programming current, the resistance value of each of the efuses 40*a*-40*n* is significantly elevated and may be infinite. Those efuses 40*a*-40*n* that are programmed to define an open circuit will interrupt the respective individual current paths.

As best shown in FIG. 2, each of the efuses 40*a*-40 *n* may have a construction as shown by the representative efuse 40*a* that includes metallic features contained in an interconnect level of a back-end-of-line (BEOL) interconnect structure and/or a middle-end-of-line (MEOL) interconnect structures. Efuse 40*a* is comprised of metal vias 41, 44 that are provided in one or more dielectric layers 48 and metal lines 42, 46 that are provided in one or more dielectric layers 50 formed over the deep trench capacitors 30*a-n*. The metal vias 41, 44 and metal lines 42, 46 may be comprised of a metallic conductor, such as aluminum or copper. In one embodiment, metal vias 41, 44 and metal lines 42, 46 may be formed using a damascene process.

Metal via 41 is connected with an upper capacitor plate of the deep trench capacitor 30*a*. Metal via 44 connects with the metal lines 42, 46, and is directly connected with metal line 42. A liner 49, 51 (e.g., a bilayer of tantalum and tantalum nitride) may be applied to clad the via openings for the vias 41, 44 and trenches for the metal lines 42, 46 before the primary metal fill material is deposited. The metal via 44 is smaller in dimensions than the metal lines 42, 46. Metal line 46 couples the efuse 40*a* associated with the deep trench capacitor 30*a* in one of the parallel paths with the resistor 18. Each of the efuses 40*b*-40*n* is comprised of a similar set of metal vias and metal lines that couple its associated deep trench capacitor 30*b*-30*n* in one of the parallel paths with the resistor 18.

A field effect transistor 54 is coupled in parallel with the resistor 18 of the timing circuit 12. The source and drain of the field effect transistor 54 (i.e., source/drains) are connected on opposite sides of the resistor 18 so that, when the gate of the field effect transistor 54 receives an appropriate logic signal, the current from the $V_{DD}$ rail 24 bypasses the resistor 18 and is instead directed through the channel of the field effect transistor 54. The field effect transistor 54 in effect provides a reset circuit that is enabled at power-on to effectively deactivate the resistor 18.

The field effect transistor 54 may be fabricated by complementary metal oxide semiconductor (CMOS) processes in front end of line (FEOL) processing and built on the same substrate as the deep trench capacitor 30*a*-30*n*. The field effect transistor 54 may include a source, a drain, a gate dielectric layer and a gate electrode comprising a gate structure. The gate dielectric layer is positioned between the gate electrode and a channel, which is itself located between the source and drain. The gate electrode may be comprised of a metal, a silicide, polycrystalline silicon (polysilicon), combinations of these materials, or any other appropriate conductor(s) deposited by physical vapor deposition (PVD), chemical vapor deposition (CVD), etc. The gate dielectric layer may be comprised of any suitable dielectric or insulating material including, but not limited to, silicon dioxide, silicon oxynitride, a high-k dielectric material such as hafnium oxide, or layered combinations of these dielectric materials, deposited by CVD, atomic layer deposition (ALD), etc. The gate dielectric layer and gate electrode may be formed from a deposited layer stack of their constituent materials that is patterned using photolithography and etching processes.

The source and drain of the field effect transistor 54 may comprise semiconductor material of the substrate that is doped by, for example, masked ion implantation with an n-type dopant (e.g., phosphorus (P) or arsenic (As)) or a p-type dopant (e.g., boron (B)). Alternatively, the source and drain may be formed by epitaxial growth in the presence of the appropriate (n-type or p-type) dopant, and may be raised. Non-conductive spacers may be formed on the exterior sidewalls of the gate structure, and the field effect transistor 54 may include other components such as halo regions, lightly-doped drain (LDD) regions, etc. The field effect transistor 54 may have a different device construction, such as being constructed as a fin-type field effect transistor.

The gate of the field effect transistor 54 is coupled with control logic 56. The control logic 56 is configured to supply an analog gate voltage to the gate of the field effect transistor 54 that is required to provide the correct logic to switch on the field effect transistor 54 at power-on of the chip. When switched on at power-on, the resistor 18 is bypassed so that the positive power supply ($V_{DD}$) rail 24 is directly coupled with the deep trench capacitors 30_a_-30_n_ through the efuses 40_a_-40_n_.

Figure 3:
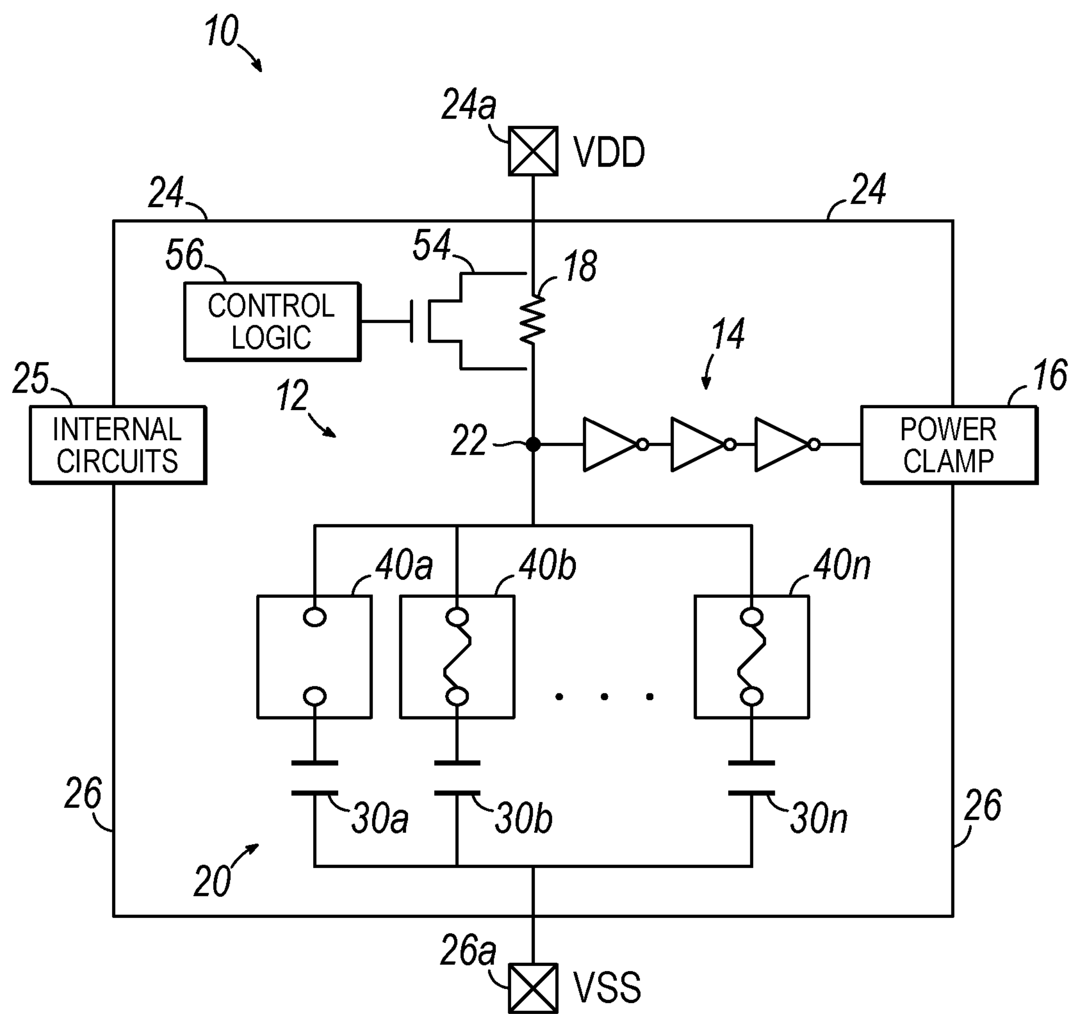
FIG. 3 is a circuit diagram similar to FIG. 1 in which one of the electronic fuses has been programmed to eliminate a deep trench capacitor, which coupled in series with the electronic fuse, from the capacitor of the timing circuit.
Figure 4:
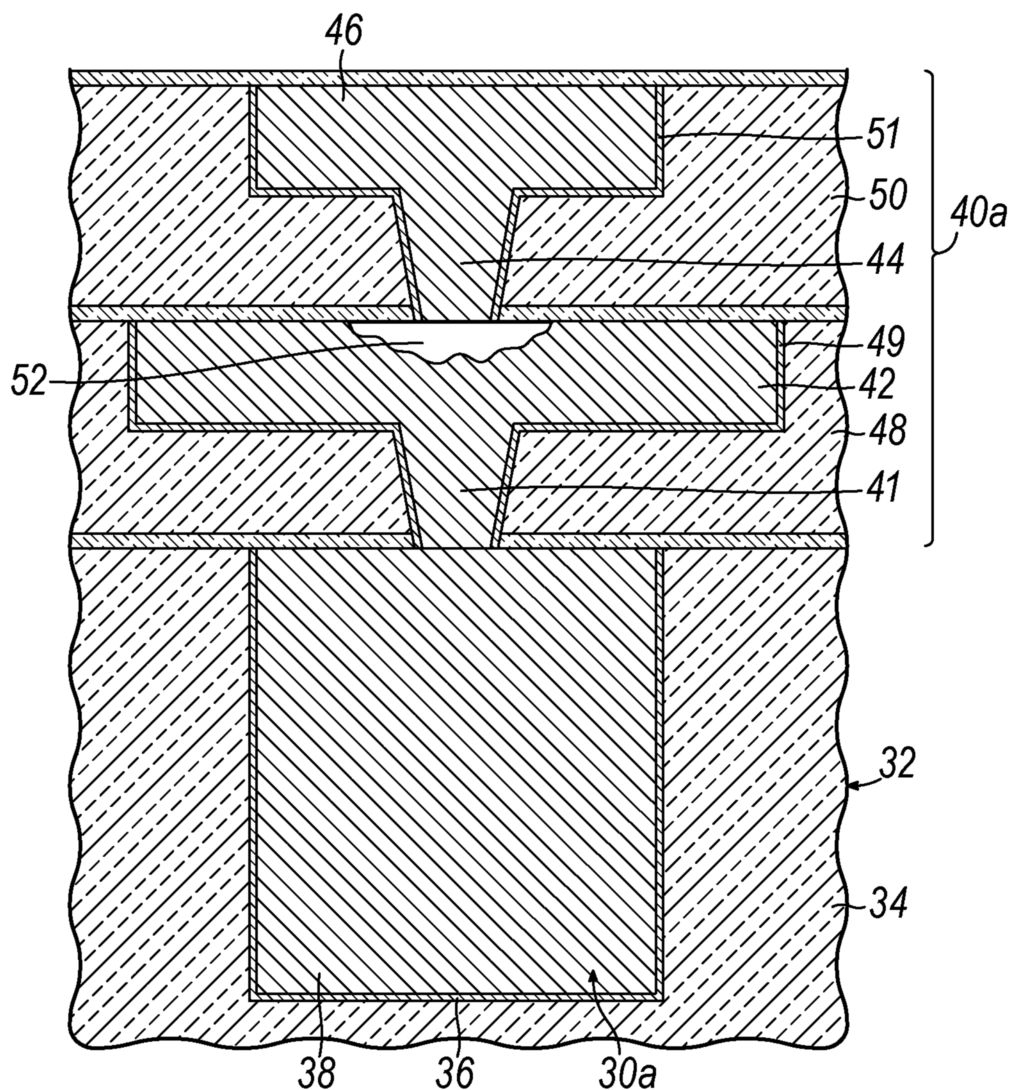
FIG. 4 is a cross-sectional view of the electronic fuse of FIG. 2 in a condition after being programmed, as diagrammatically depicted in FIG. 3, to remove the corresponding one of the deep trench capacitors from the capacitor of the timing circuit.

In use and with reference to FIGS. 3 and 4, the gate of the field effect transistor 54 is provided with a gate voltage from the control logic 56 at the time of power-on of the chip, which effectively defines a current path through the body of the field effect transistor 54 that bypasses the resistor 18. When the bypass is active, each paired set of efuses 40_a-n_ and deep trench capacitors 30_a-n_ are directly coupled with the $V_{DD}$ rail 24. A programming current is supplied to the efuses 40_a-n_ that are coupled with deep trench capacitors 30_a-n_ that are either defective and/or exhibit an abnormally low impedance. The programming current causes the impacted efuses 40_a_-40_n_ to respond by becoming permanently and irreversibly opened, which disconnects the associated one of the deep trench capacitors 30_a_-30_n_ from the timing circuit 12. If one or more of the deep trench capacitors 30_a_-30_n_ is defective or exhibits an abnormally low impedance, the timing circuit 12 is not placed into a defective condition. After programming at the time of power-on, the control logic 56 discontinues the application of the logic voltage to the gate of the field effect transistor 54 so that the resistor 18 is not bypassed and so that the timing circuit 12 is restored to its normal operating state.

As a representative example and as shown in FIG. 3, the deep trench capacitor 30_a_ associated with efuse 40_a_ may exhibit an abnormally low impedance. When the field effect transistor 54 is activated to bypass the resistor 18, the efuse 40_a_ will receive a programming current that places the efuse 40_a_ in an open state. The opening of the efuse 40_a_ defines an open circuit between the deep trench capacitor 30_a_ and the $V_{DD}$ rail 24. The deep trench capacitor 30_a_ is thereby excluded from the capacitor 20 and does not participate in the timing circuit 12. The deep trench capacitor 30_a_ is disconnected from the timing circuit 12 and the capacitance of the capacitor 20 is reduced, which will slightly decrease the time constant of the timing circuit 12. However, the time constant of the timing circuit 12 may still be within a tolerance for providing an adequate response to an ESD event during normal operation.

When the field effect transistor 54 is activated to bypass the resistor 18, a non-programming current flows through the efuses 40_b_-40_n_ coupled with deep trench capacitors 30_b_-30_n_ that are not defective or do not exhibit an abnormally low impedance. The non-programming current is less than the programming current. As a result, these efuses 40_b_-40_n_ remain closed.

The programming of the efuse 40_a_ coupled with the deep trench capacitor 30_a_ is automatic and autonomous. In this manner, the timing circuit 12 of the ESD protection circuit 10 is self-healing in that defective deep trench capacitor 30_a_ is systematically excluded from the capacitor 20 by the efuse programming while the non-defective deep trench capacitors 30_b_-30_n_ are unaffected and still contribute to the capacitance of the capacitor 20.

As best shown for the representative efuse 40_a_ and deep trench capacitor 30_a_ in FIG. 4, the efuse 40_a_ may be opened by the formation of a void 52 at the juncture between the metal via 44 and the metal line 42. The void 52 interrupts electrical continuity between the metal via 44 and the metal line 42, which disconnects the deep trench capacitor 30_a_ from the circuit. Alternatively, another mechanism may be employed to cause the efuse 40_a_ to open when subjected to a programming current and thereby provide an extremely large or infinite resistance.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to or with another element, there are no intervening elements present. When an element is described as being "indirectly connected" or "indirectly coupled" to or with another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a timing circuit for an electrostatic protection circuit, the method comprising:

forming, using a substrate, a first capacitor element and a second capacitor element of a capacitor of the timing circuit;

forming a first electronic fuse coupled with the first capacitor element;

forming a second electronic fuse coupled with the second capacitor element;

forming a resistor coupled in series with the first capacitor element and coupled in series with the second capacitor element; and forming, using the substrate, a field effect transistor that is directly coupled in parallel with the resistor.

2. The method of claim 1 wherein the first capacitor element and the second capacitor element are each formed using a deep trench defined in the substrate.

3. The method of claim 1 wherein the first capacitor element is coupled in series with the first electronic fuse, and the second capacitor element is coupled in series with the second electronic fuse.

4. The method of claim 1 wherein the first capacitor element is coupled in parallel with the second capacitor element.

5. The method of claim 1 wherein the first electronic fuse and the second electronic fuse are comprised of metallic features in one or more interconnect levels of an interconnect structure.

6. The method of claim 1 further comprising:

coupling the first electronic fuse and the first capacitor element in a first current path between a positive power supply rail and a negative power supply rail; and coupling the second electronic fuse and the second capacitor element in a second current path between the positive power supply rail and the negative power supply rail, wherein the first current path and the second current path each include the resistor.

7. A method of operating a timing circuit of an electrostatic discharge protection circuit, the method comprising:

applying a programming current to a first electronic fuse coupled in series with a first capacitor element of a capacitor of the timing circuit; and applying a non-programming current to a second electronic fuse coupled in series with a second capacitor element of the capacitor of the timing circuit, wherein the timing circuit further includes a resistor coupled in series with the first capacitor element and with the second capacitor element, the timing circuit is formed in association with a chip, and the resistor is bypassed with a current path from a positive power supply rail to the first electronic fuse and the second electronic fuse, when the chip and the timing circuit are initially powered, to provide the programming current and the non-programming current.

8. The method of claim 7 wherein power is diverted from the positive power supply rail through a field effect transistor to the first electronic fuse and the second electronic fuse when the resistor is bypassed with the current path.

9. The method of claim 7 wherein the timing circuit further includes a resistor coupled in series with the first capacitor element and coupled in series with the second capacitor element, the first capacitor element and the second capacitor element are coupled in parallel, and further comprising:

directing a portion of the current from an electrostatic discharge (ESD) event through a current path including the resistor and the second capacitor element.

10. The method of claim 9 further comprising:

in response to the ESD event, providing a trigger signal from the timing circuit to a power clamp device.

11. An electrostatic discharge protection circuit comprising:

a timing circuit including a resistor coupled with a positive power supply rail and a capacitor that is coupled with the resistor at a node, the capacitor including a plurality of parallelly arranged capacitor elements;

a field effect transistor coupled between the positive power supply rail and the node, the field effect transistor directly coupled in parallel with the resistor;

a power clamp device coupled with the timing circuit at the node; and a plurality of electronic fuses each coupled with a respective one of the capacitor elements.

12. The electrostatic discharge protection circuit of claim 11 wherein the field effect transistor has a first source/drain coupled with the positive power supply rail and a second source/drain coupled with the node.

13. The electrostatic discharge protection circuit of claim 11 wherein each of the capacitor elements is a deep trench capacitor.

14. The electrostatic discharge protection circuit of claim 11 wherein the power clamp device is a field effect transistor.

15. The electrostatic discharge protection circuit of claim 11 wherein each of the capacitor elements is coupled in series with one of the electronic fuses.

16. The electrostatic discharge protection circuit of claim 11 wherein each of the capacitor elements comprises a first capacitor plate, a second capacitor plate, and a dielectric layer between the first and second capacitor plates, each electronic fuse is coupled with the first capacitor plate of a respective one of the capacitor elements, and the second capacitor plate of each electronic fuse is coupled with a negative power supply rail.

* * * * *